(12) United States Patent
Asano

(10) Patent No.: US 7,777,539 B2
(45) Date of Patent: Aug. 17, 2010

(54) DELAY ADJUSTING CIRCUIT AND CONTROL METHOD OF THE SAME

(75) Inventor: Shigetaka Asano, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/882,788

(22) Filed: Aug. 6, 2007

(65) Prior Publication Data

US 2008/0036515 A1 Feb. 14, 2008

(30) Foreign Application Priority Data

Aug. 9, 2006 (JP) ............................. 2006-216587

(51) Int. Cl.
*H03L 7/06* (2006.01)
(52) U.S. Cl. ...................................... 327/149; 327/270
(58) Field of Classification Search ...................... None
See application file for complete search history.

(56) References Cited

U.S. PATENT DOCUMENTS 7,071,746 B2 * 7/2006 Suda et al. .................. 327/158

7,639,169 B2 * 12/2009 Tanizawa .................... 341/155
2009/0167379 A1 * 7/2009 Mobin et al. ................ 327/149

FOREIGN PATENT DOCUMENTS

JP 11-261408 A 9/1999
JP 2005-012666 A 1/2005

* cited by examiner

*Primary Examiner*—Tuan Lam
*Assistant Examiner*—Hiep Nguyen
(74) *Attorney, Agent, or Firm*—Arent Fox LLP

(57) ABSTRACT

A delay adjusting circuit including a delay part in which delay elements of n+1 (n≧2) stages are connected to each other in series, a first phase comparator for detecting whether a first edge that is a transition edge of a signal of an n−1-th stage of the delay part from a first logic level to a second logic level advances from a first reference signal edge that is a transition edge of a first reference signal from the first logic level to the second logic level, a second phase comparator for detecting whether a second edge that is a transition edge of a signal of an n+1-th stage of the delay part from the first logic level to the second logic level delays from the first reference signal edge, and a delay element adjusting part that corrects a second reference signal so that the first edge advances from the first reference signal edge in the first phase comparator and the second edge delays from the first reference signal edge in the second phase comparator, and that outputs a reference bias signal for adjusting delay times of the delay elements of the delay part.

9 Claims, 11 Drawing Sheets

BLOCK DIAGRAM SHOWING CONSTRUCTION OF DELAY ADJUSTING CIRCUIT ACCORDING TO EMBODIMENT

FIG.1 BLOCK DIAGRAM SHOWING CONSTRUCTION OF DELAY ADJUSTING CIRCUIT ACCORDING TO EMBODIMENT

CIRCUIT DIAGRAM SHOWING EXAMPLE OF V-I CONVERTING CIRCUIT

FIG.3 CIRCUIT DIAGRAM SHOWING EXAMPLE OF I-V CONVERTING CIRCUIT

CIRCUIT DIAGRAM SHOWING EXAMPLE OF DELAY ELEMENT

FIG.5 CIRCUIT DIAGRAM SHOWING EXAMPLE OF ADJUSTING CIRCUIT

FIG.6 CIRCUIT DIAGRAM SHOWING EXAMPLE OF CURRENT MULTIPLYING CIRCUIT

TIMING CHART SHOWING RELATIONSHIP BETWEEN Cref AND DELAY TIME OF EACH DELAY

FIG.9 TIMING CHART SHOWING RELATIONSHIP BETWEEN Cref AND DELAY TIME OF EACH DELAY

FLOWCHART SHOWING PROCESSING SEQUENCE OF CONTROL PART

CIRCUIT DIAGRAM OF CONVENTIONAL TIMING SIGNAL GENERATING CIRCUIT

DELAY ADJUSTING CIRCUIT AND CONTROL METHOD OF THE SAME

CROSS-REFERENCE TO RELATED APPLICATIONS

This application is based upon and claims the benefit of priority from the prior Japanese Patent Application No. 2006-216587 filed on Aug. 9, 2006, the entire contents of which are incorporated herein by reference.

BACKGROUND

1. Field

The embodiment relates to a delay adjusting circuit.

2. Description of Related Art

A delay adjusting circuit using a bias signal from a DLL as a reference is disclosed in Japanese Patent Publication No. H11-261408. As shown in FIG. 11 of aforementioned Japanese Patent Publication, a parent circuit 101 and child circuit 102 are provided, the circuit 101 that feed-back controls and generates an inner signal CKin having the same period or phase as that of an inputted reference signal CKr, and the circuit 102 that receives the inner signal CKin and a control signal CS from the parent circuit 101 to generate a timing signal TS having a predetermined timing to the reference signal CKr are configured. According to the conventional delay adjusting circuit, a plurality of timing signals each synchronized with a reference clock and having a predetermined phase can be generated with a simple constitution and at high precision.

Additionally, another related art is disclosed in Japanese Patent Publication No. 2005-012666.

SUMMARY

The present embodiment provides that a delay adjusting circuit including a delay part in which delay elements of n+1 (n≧2) stages are connected to each other in series, a first phase comparator for detecting whether a first edge that is a transition edge of a signal of an n−1-th stage of the delay part from a first logic level to a second logic level advances from a first reference signal edge that is a transition edge of a first reference signal from the first logic level to the second logic level, a second phase comparator for detecting whether a second edge that is a transition edge of a signal of an n+1-th stage of the delay part from the first logic level to the second logic level delays from the first reference signal edge, and a delay element adjusting part that corrects a second reference signal so that the first edge advances from the first reference signal edge in the first phase comparator and the second edge delays from the first reference signal edge in the second phase comparator, and that outputs a reference bias signal for adjusting delay times of the delay elements of the delay part.

DETAILED DESCRIPTION OF THE PREFERRED EMBODIMENTS

An embodiment of an amplifier of the embodiment will be described in detail hereinafter with reference to FIG. 1 through FIG. 10.

Figure 1:
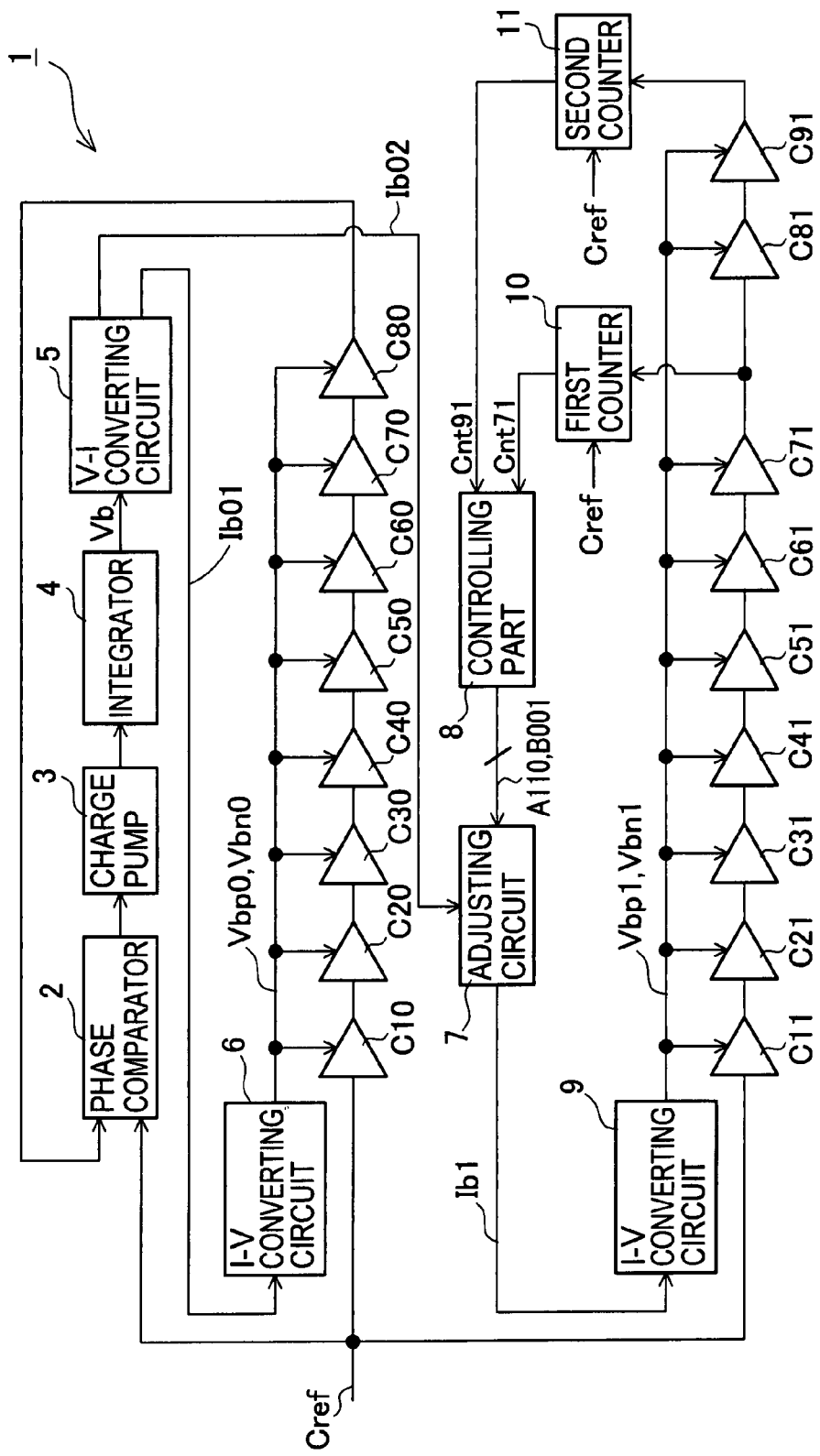
FIG. 1 is a block diagram showing a constitution of a delay adjusting circuit according to an embodiment.

FIG. 1 is a block diagram showing a constitution of a delay adjusting circuit 1 according to the embodiment. The delay adjusting circuit 1 includes a DLL (Delay Locked Loop) constituted by: a phase comparator 2; a charging pump 3; an integrator 4; a V-I converting circuit 5; an I-V converting circuit 6; and delay elements C10, C20, C30, C40, C50, C60, C70, and C80. Additionally, the delay adjusting circuit 1 further includes: an adjusting circuit 7; a controlling part 8; an I-V converting circuit 9; a first counter 10; a second counter 11; and delay elements C11, C21, C31, C41, C51, C61, C71, C81, and C91, and adjusts delay values of the delay elements C11, C21, C31, C41, C51, C61, C71, C81, and C91.

The delay element C71 is connected to a clock terminal of the first counter 10, and a reference signal Cref is inputted into a count enabling terminal of the counter 10. That is, the first counter 10 counts high-level of the reference signal Cref based on a rising edge of an output signal of the delay element C71. Thus, although a complicated circuit for phase comparison is normally required, the first counter 10 can be constituted by a simple circuit which takes a reference signal in at a first edge.

The delay element C91 is connected to a clock terminal of the second counter 11, and the reference signal Cref is inputted into a count enabling terminal of the counter 11. That is, the second counter 11 counts the high-level of the reference signal Cref based on a rising edge of an output signal of the delay element C91. Thus, although a complicated circuit for phase comparison is normally required, the second counter 11 can be constituted by a simple circuit which takes the reference signal in at a second edge.

In the DLL, one period of the reference signal Cref is locked to be the same as delay values of the delay elements C10 to C80. A reference signal Vb generated at that time is supplied to the I-V converting circuit 6 for supplying a bias voltage to the delay element C10 to C80 and the adjusting circuit 7 as the same current from the integrator 4 via the V-I converting circuit 5.

Figure 2:
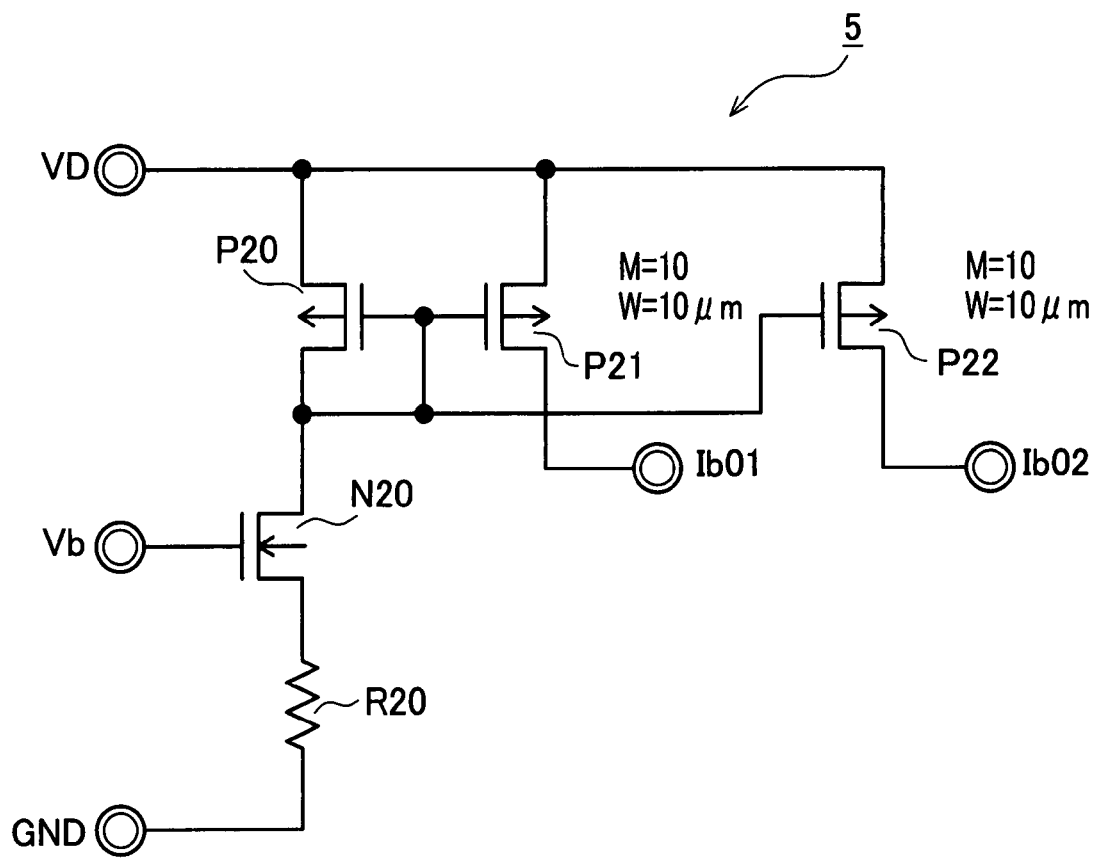
FIG. 2 is a circuit diagram showing an example of a V-I converting circuit.

FIG. 2 is a circuit diagram showing an example of the V-I converting circuit 5. The V-I converting circuit 5 includes: PMOS transistors P20, P21, and P22; a NMOS transistor N20; and a resistance element R20. The PMOS transistors P20, P21, and P22 constitute a current mirror circuit. When the reference signal Vb is inputted into a gate terminal of the NMOS transistor N20, a current having the same value is outputted from the PMOS transistors P21 and P22 which are output side transistors of the current mirror circuit.

Figure 3:
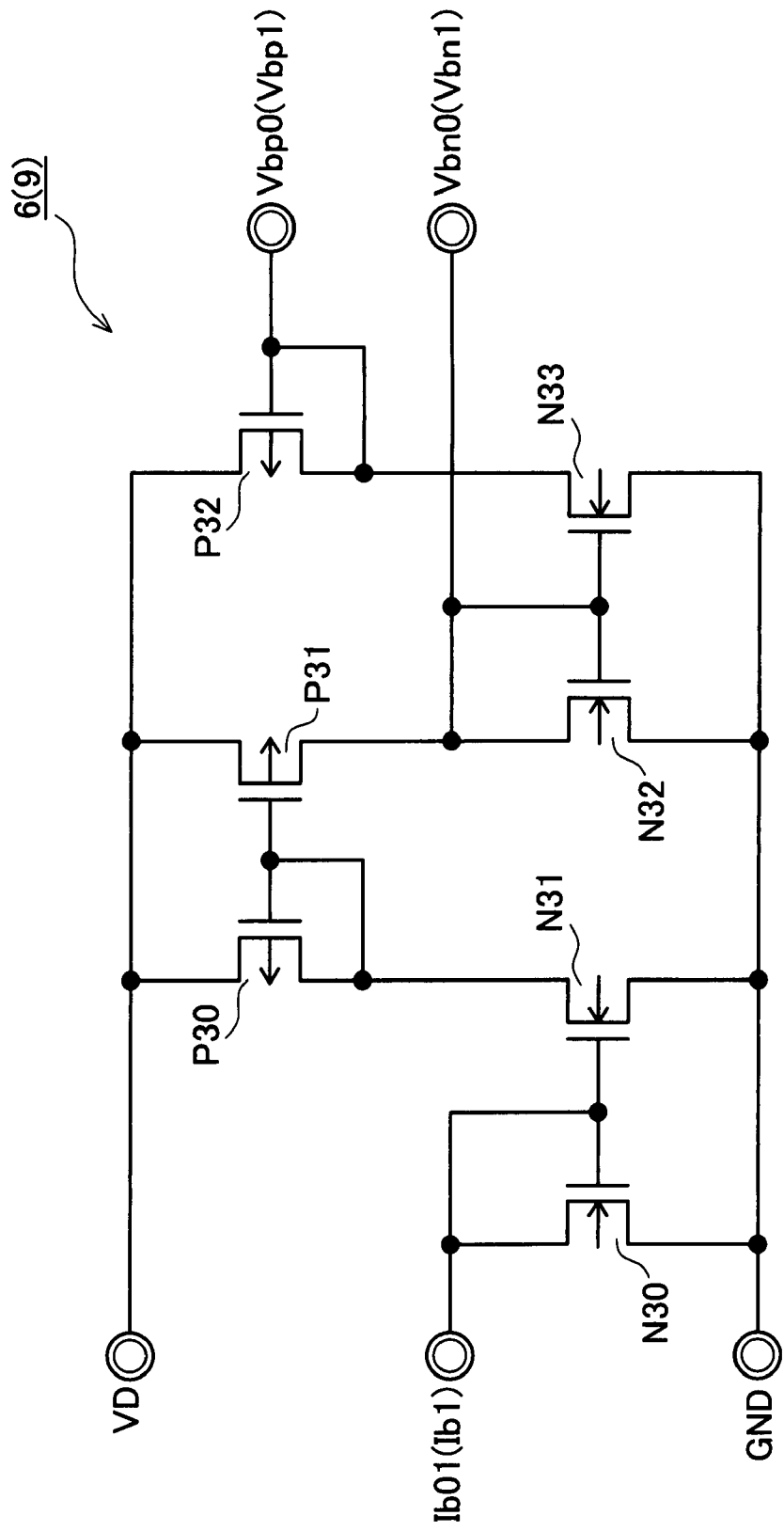
FIG. 3 is a circuit diagram showing an example of an I-V converting circuit.

The I-V converting circuit 6 and I-V converting circuit 9 are constituted by the same circuit. FIG. 3 is an example of the I-V converting circuit 6 or I-V converting circuit 9. The I-V converting circuit 6 (9) includes: PMOS transistors P30, P31, and P32; and NMOS transistors N30, N31, N32, and N33. The NMOS transistors N30, N31, PMOS transistors P30, P31, and NMOS transistors N32 and N33 each constitute a current mirror circuit. When current is inputted into an input terminal Ib01 (Ib1), the same current as current flowing through the NMOS transistor N30 flows through the NMOS transistor N31. Then, the same current as current flowing through the PMOS transistor P30 flows through the PMOS transistor P31, and further the same current as current flowing through the NMOS transistor N32 flows through the NMOS transistor N33. Therefore, when many currents flow through the input terminal Ib01 (Ib1), the potential of a bias voltage Vbn0 (Vbn1) is raised, and the potential of a bias voltage Vbp0 (Vbp1) is lowered.

Figure 4:
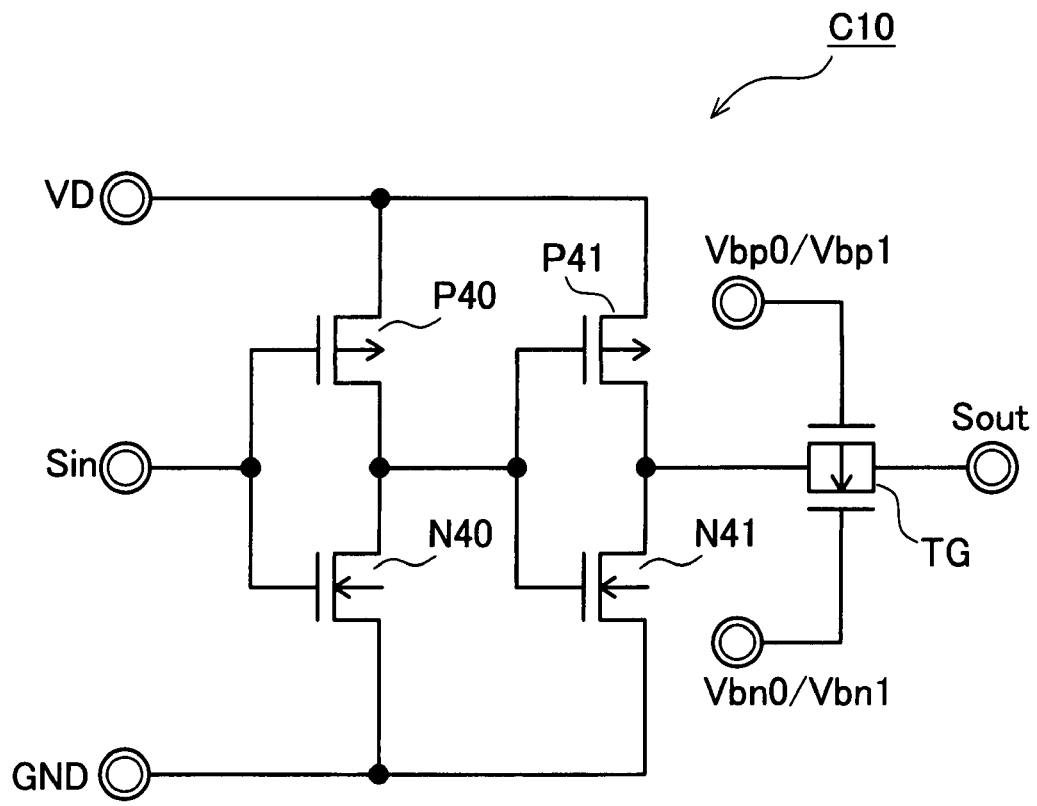
FIG. 4 is a circuit diagram showing an example of a delay element.

The delay elements C10, C20, C30, C40, C50, C60, C70, C80, C11, C21, C31, C41, C51, C61, C71, C81, and C91 are constituted by the same circuit. FIG. 4 is a circuit diagram showing an example of the delay element C10. The delay element C10 includes: PMOS transistors P40 and P41; NMOS transistors N40 and N41; and a transfer gate TG.

The PMOS transistor P40 and NMOS transistor N40, and PMOS transistor P41 and NMOS transistor N41 each constitute an inverter. A buffer is constituted by two stages of the inverters. The transfer gate TG is connected to the rear stage of the buffer, a transfer impedance of the transfer gate TG changes in accordance with the bias voltages Vbp0 (Vbp1), Vbn0 (Vbn1) inputted into the gate, and the delay time changes. A transfer gate part, in which the transfer impedance on a path thus changes by the bias voltages Vbp0 (Vbp1), Vbn0 (Vbn1) and the delay time changes, is employed so that a delay element capable of adjusting the delay time can be easily constituted.

Figure 5:
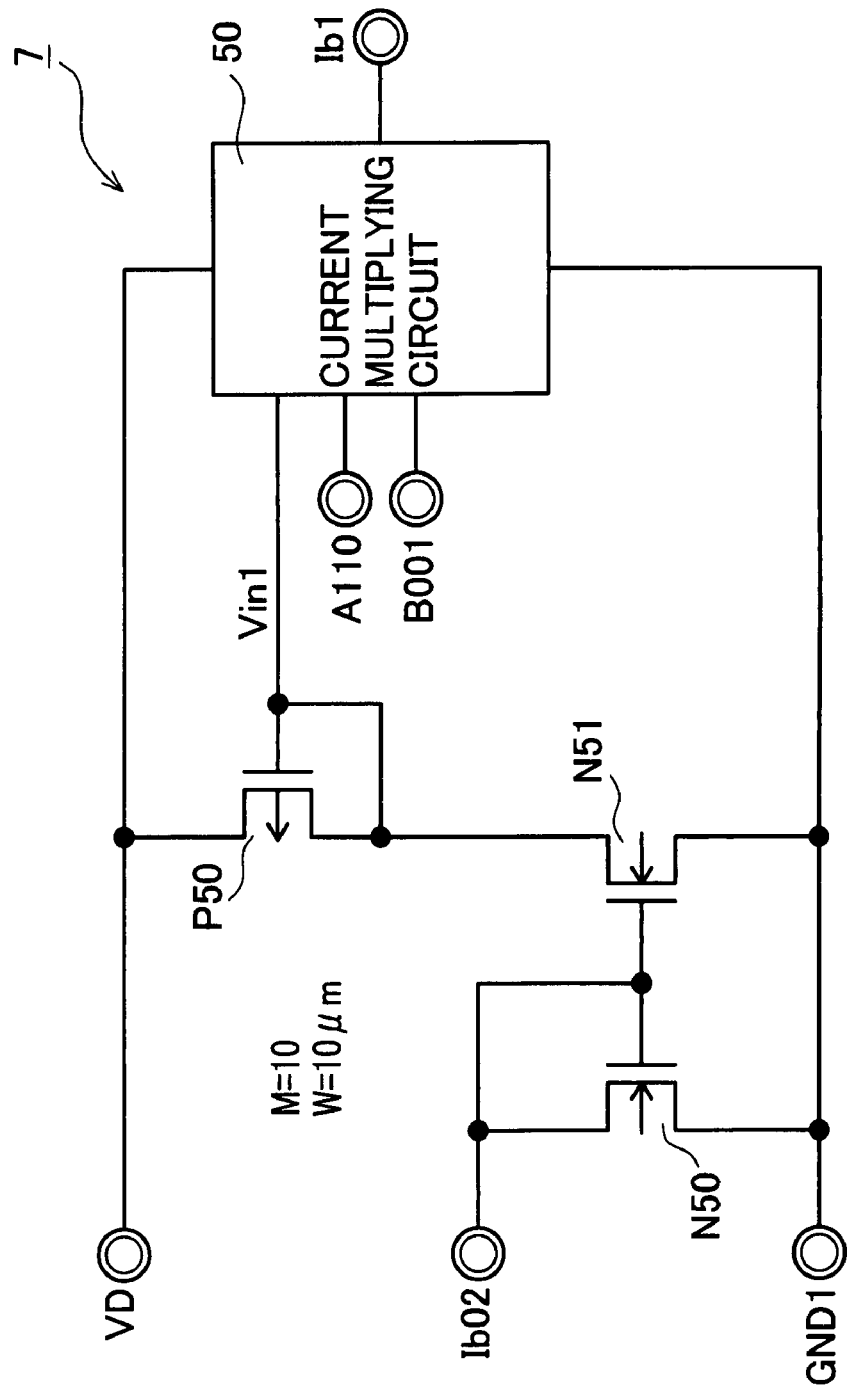
FIG. 5 is a circuit diagram showing an example of an adjusting circuit.

FIG. 5 is a circuit diagram showing an example of the adjusting circuit 7. The adjusting circuit 7 includes: a PMOS transistor P50; NMOS transistors N50 and N51; and a current multiplying circuit 50. The NMOS transistors N50 and N51 constitute a current mirror circuit, and a current flowing through the NMOS transistor N50 corresponds to a current flowing through the NMOS transistor N51. An output voltage Vin1 connected to a gate and drain terminals of the PMOS transistor N50 to be outputted to the current multiplying circuit 50 changes in accordance with the current value of an input current Ib02. For example, the output voltage Vin1 is reduced when the current value of the input current Ib02 is large, and the Vin1 is raised when the current value of the input current Ib02 is small.

Figure 6:
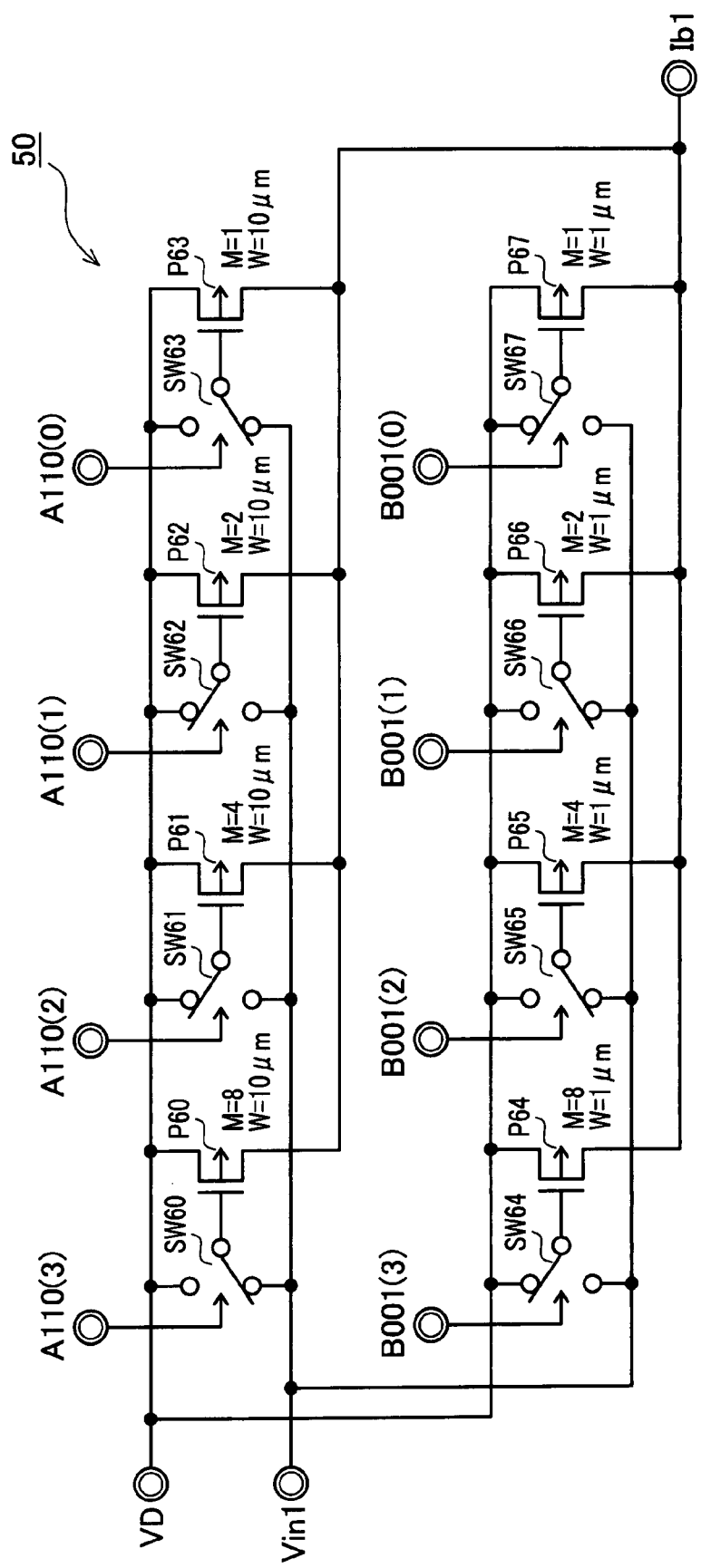
FIG. 6 is a circuit diagram showing an example of a current multiplying circuit.

FIG. 6 is a circuit diagram showing an example of the current multiplying circuit 50. The current multiplying circuit 50 includes: PMOS transistors P60, P61, P62, P63, P64, P65, P66, and P67; and switches SW60, SW61, SW62, SW63, SW64, SW65, SW66, and SW67. Adjusting coefficients A110 (3) to (0) from the controlling part are connected to the switches SW60, SW61, SW62, and SW63 respectively, adjusting coefficients B001 (3) to (0) from the controlling part are connected to the switched SW64, SW65, SW66, and SW67 respectively, and the controlling part is controlled by a CPU or sequencer not shown.

In FIG. 6, "M" attached to each transistor denotes the number of parallel transistors, and "W" denotes a transistor width. A non-conductive state is generated when the switch is connected to a source voltage VD side, and therefore no current is outputted from the transistor having a gate to which an output of the switch is connected. On the other hand, when the switch is connected to the output voltage Vin1 side, the output voltage Vin1 and a current according to "M" and "W" of the transistor are outputted from the transistor having the gate to which the output of the switch is connected. When the number of parallel transistors M is 10 and the transistor width W is 10 μm in a synthesized value of "M" and "W," a current 1.0 times as large as the input current Ib02 is outputted from the output terminal Ib1.

The transistor width W to be set by the adjusting coefficients A110 (3) to (0) is set to 10 μm, which is ten times as long as the transistor width W to be set by the adjusting coefficients B001 (3) to (0), 1 μm. Additionally, the numbers of parallel transistors M to be set by the adjusting coefficients A110 (3) to (0) and adjusting coefficients B001 (3) to (0) are set to 8, 4, 2, and 1 respectively. For example, when setting to the adjusting coefficients A110 (3) to (0) is made the same as that of adjusting coefficients B001 (3) to (0), a current ten times as large as the input current Ib02 is outputted from the output terminal Ib1.

In a state of FIG. 6, since the output voltage Vin1 is inputted into the gates of PMOS transistor P60, of which the number of parallel transistors M is 8 and the transistor width W is 10 μm, PMOS transistor P63, of which M is 1 and W is 10 μm, PMOS transistor P65, of which M is 4 and W is 1 μm, and PMOS transistor P66, of which M is 2 and W is 1 μm, a current 0.96 times as large as the input current Ib02 is outputted from the output terminal Ib1.

Next, a relationship between the reference signal Cref and the delay time of each delay will be described. The first counter 10 (FIG. 1) counts the high-level of the reference signal Cref based on the rising edge of the signal from the delay element C71, and the second counter 11 (FIG. 1) counts the high-level of the reference signal Cref based on the rising edge of the signal from the delay element C91. Thus, phase relationships between the reference signal Cref and delay element C71 and between the Cref and delay element C91 are detected.

In the embodiment, the first counter 10 counts the number of high-level times of the reference signal Cref while the rising edge of the signal from the delay element C71 is generated sixteen times. Additionally, the second counter 11 counts the number of high-level times of the reference signal Cref while the rising edge of the signal from the delay element C91 is generated sixteen times.

Figure 7:
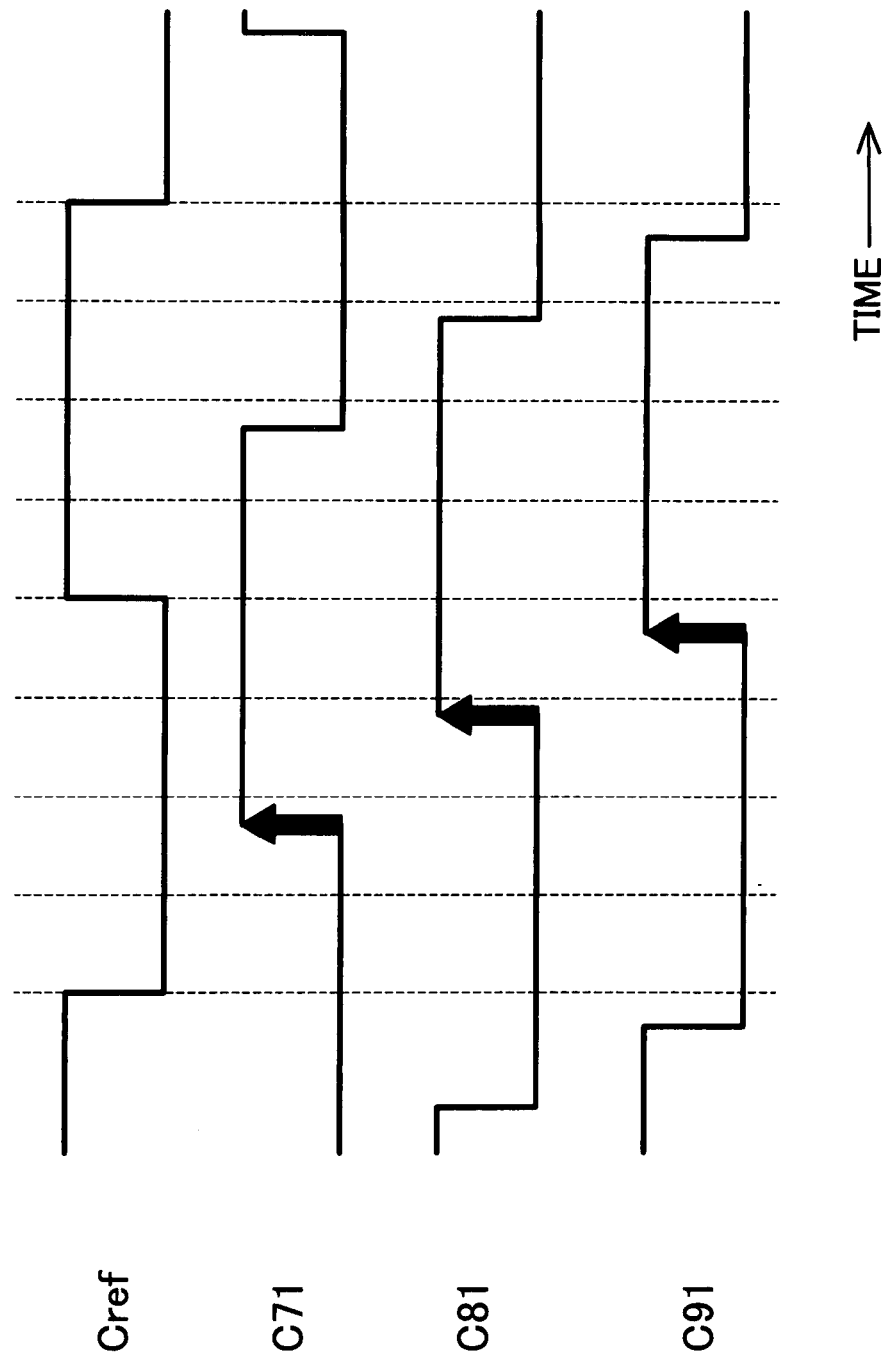
FIG. 7 is a timing chart showing a relationship between a Cref and a delay time of each delay.

A relationship in the case where the delay times of the delay elements C71, C81, and C91 are too small is shown in FIG. 7. In this case, the high-level times count 0 in the first counter 10 and second counter 11.

Figure 8:
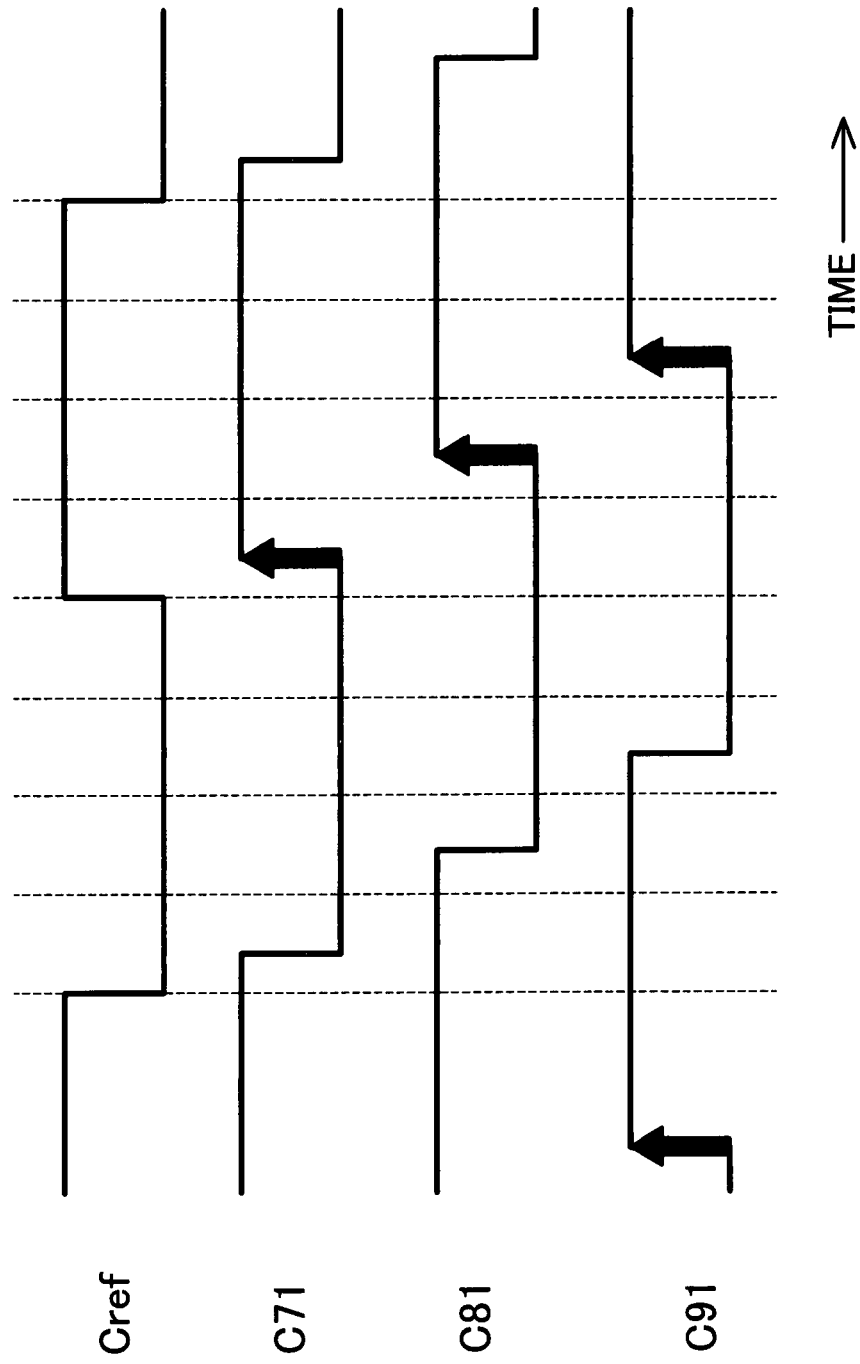
FIG. 8 is a timing chart showing a relationship between the Cref and a delay time of each delay.

A relationship in the case where the delay times of the delay elements C71, C81, and C91 are too large is shown in FIG. 8. In this case, the high-level times count a maximum value (16 in the embodiment) in the first counter 10 and the second counter 11.

Figure 9:
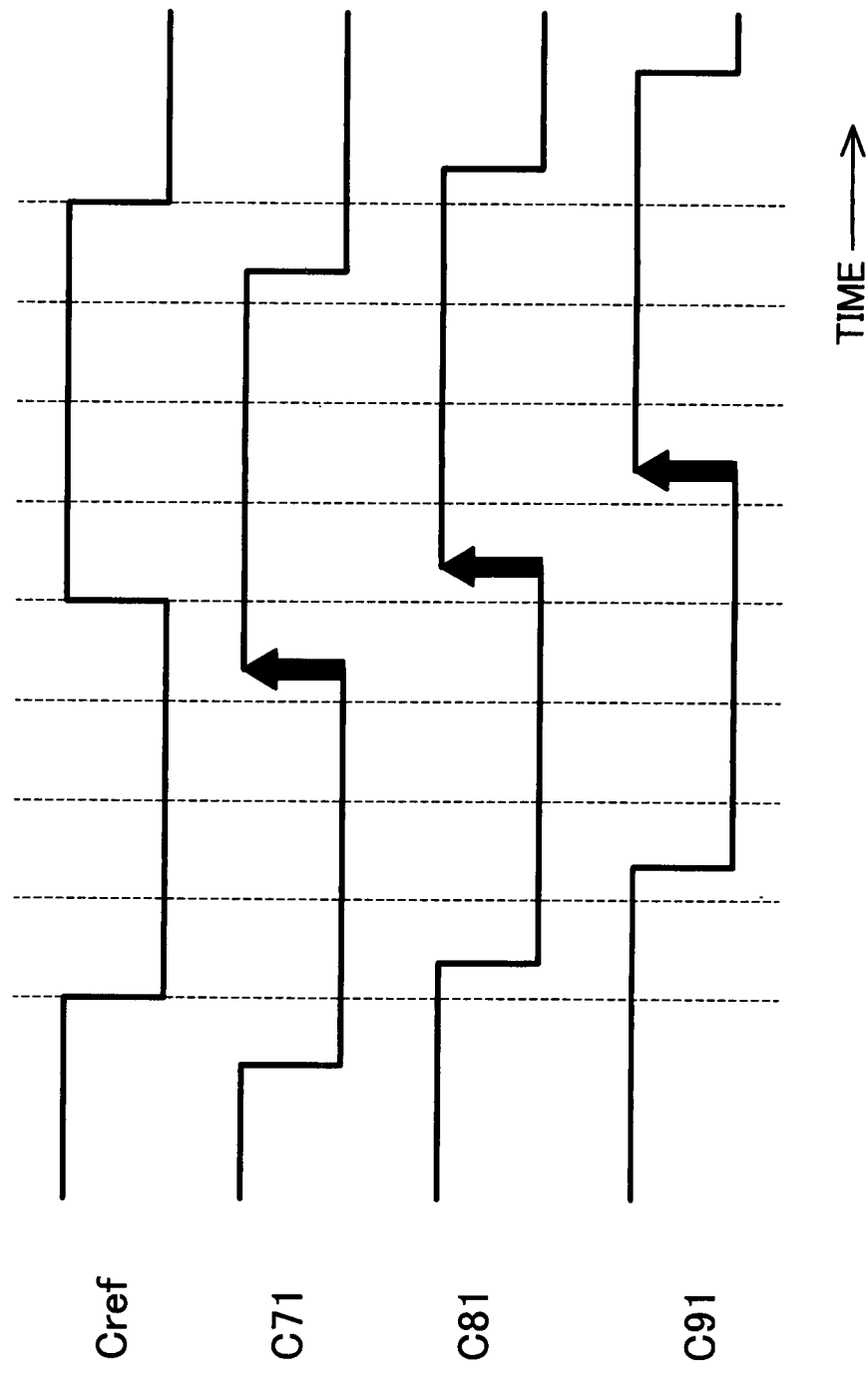
FIG. 9 is a timing chart showing a relationship between the Cref and a delay time of each delay.

A relationship in the case where the delay times of the delay elements C71, C81, and C91 are appropriate is shown in FIG. 9. In this case, the high-level times count zero in the first counter 10, and count the maximum value (16 in the embodiment) in the second counter 11. Additionally, in this case, when the rising edge of the output of the delay element C71 is closest to a rising edge of the reference signal Cref, a rising edge of an output of the delay element C81 delays from the rising edge of the reference signal Cref by an approximate delay time of the delay element C81. On the other hand, when the rising edge of the output of the delay element C91 is closest to the rising edge of the reference signal Cref, the rising edge of the output of the delay element C81 advances from the rising edge of the reference signal Cref by an approximate delay time of the delay element C91. That is, the rising edges of the reference signal Cref and delay element C81 are in a range from the advance of the delay element C91 by the delay time to the delay of the delay element C81 by the delay time.

Figure 10:
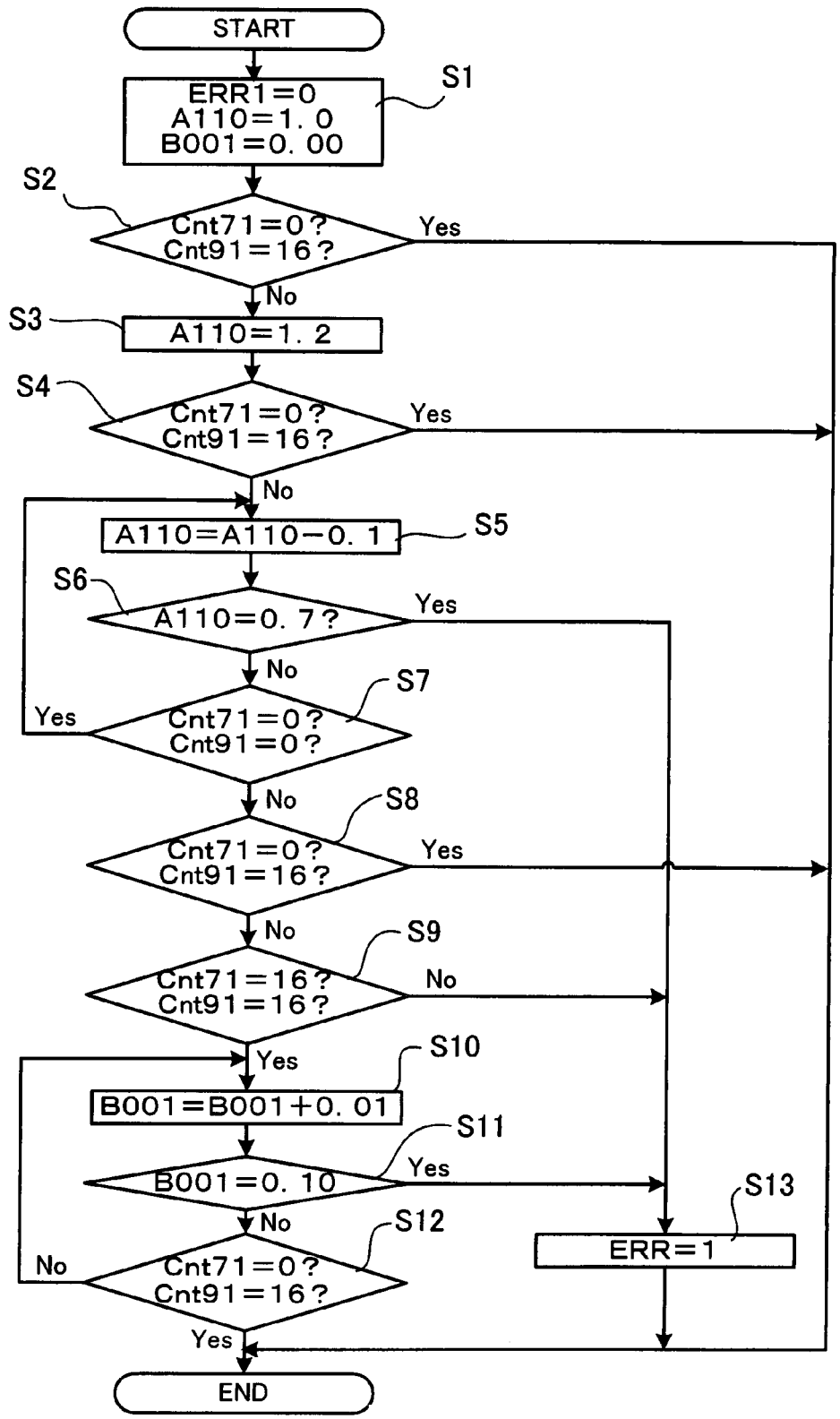
FIG. 10 is a flow chart showing a processing sequence of a controlling part.
Figure 11:
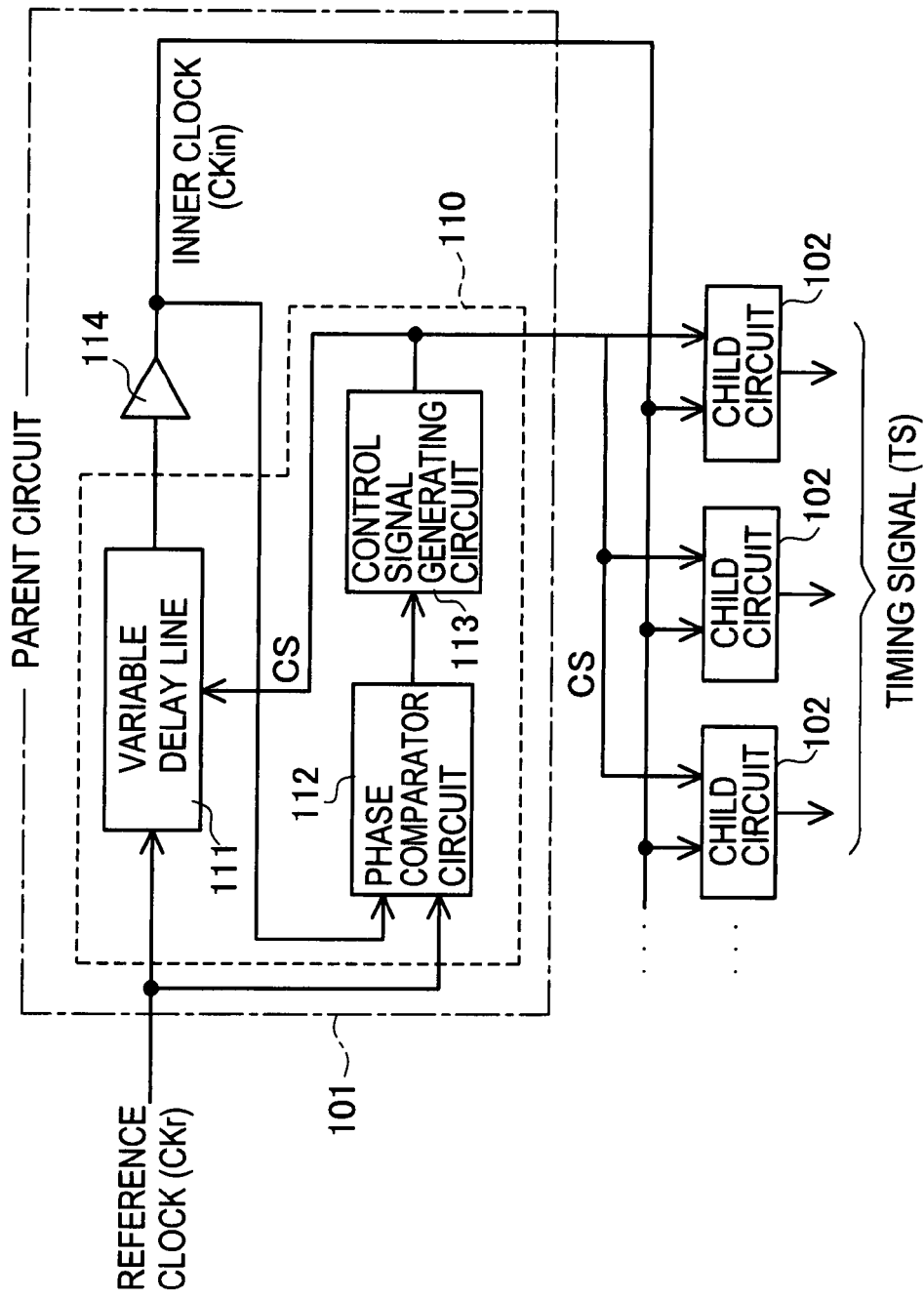
FIG. 11 is a circuit diagram of a conventional timing signal generating circuit.

Next, operation of the controlling part 8 will be described. The controlling part 8 is controlled by the CPU or sequencer not shown. FIG. 10 is a flow chart showing a processing sequence of the controlling part 8. The case is described where a count value Cnt71 outputted from the first counter 10 and count value Cnt91 outputted from the second counter 11 are 16 in the embodiment. However, the count values Cnt71 and Cnt91 may be one or more. In such a case, the judgment portion "whether the count value is 16" is converted and applied to the set count values Cnt71 and Cnt91 in the following comparison.

First, in Step S1, an error flag ERR1, the adjusting coefficients A110 (3) to (0) and the adjusting coefficient B001 (3) to (0) are initialized to 0, 1.0, 0.00 respectively.

In Step S2, it is judged whether the count value Cnt71 is 0 and the count value Cnt91 is 16. In the case of Yes, since the delay time is appropriate as shown in FIG. 9, the processing is ended. In the case of No, it proceeds to Step S3.

In Step S3, the adjusting coefficients A110 (3) to (0) are set to a maximum adjusting value (1.2 in the embodiment).

In Step S4, it is judged whether the count value Cnt71 is 0 and the count value Cnt91 is 16. In the case of Yes, since the delay time is appropriate as shown in FIG. 9, the processing is ended. In the case of No, it proceeds to Step S5 for further adjusting the adjusting coefficients A110 (3) to (0).

0.1 is subtracted from the adjusting coefficients A110 (3) to (0) in Step S5, and it proceeds to Step S6.

In Step S6, it is judged whether the adjusting coefficients A110 (3) to (0) are a nonadjustable value (0.7 in the embodiment). In the case of Yes, it is judged to be nonadjustable and the error flag ERR1 is set, and then it proceeds to step 13. In the case of No, it proceeds to step 7 so that adjustments of the adjusting coefficients A110 (3) to (0) are continued.

In Step S7, it is judged whether the count value Cnt71 is 0 and the count value Cnt91 is 0. In the case of Yes, it proceeds to Step S5, and in the case of No, it proceeds to Step S8.

In Step S8, it is judged whether the count value Cnt71 is 0 and the count value Cnt91 is 16. In the case of Yes, since the delay time is appropriate as shown in FIG. 9, the processing is ended. In the case of No, it proceeds to Step S9.

In Step S9, it is judged whether the count value Cnt71 is 16 and the count value Cnt91 is 16. In the case of Yes, it proceeds to Step S10, and in the case of No, it is judged the adjusting coefficients A110 (3) to (0) are nonadjustable and it proceeds to Step S13.

0.01 is added to the adjusting coefficients B001 (3) to (0) in Step S10, and it proceeds to Step S11.

In Step S11, it is judged whether the adjusting coefficients B001 (3) to (0) are 0.01. In the case of Yes, it is judged to be nonadjustable and it proceeds to Step S13, and in the case of No, it proceeds to Step S12.

In Step S12, it is judged whether the count value Cnt71 is 0 and the count value Cnt91 is 16. In the case of Yes, since the delay time is appropriate as shown in FIG. 9, the processing is ended. In the case of No, it proceeds to Step S10 for further finely adjusting the adjusting coefficients B001 (3) to (0).

In Step S13, since the adjusting coefficients B001 (3) to (0) are judged to be nonadjustable, 1 is set to the error flag ERR1 and the processing is ended.

In the controlling part 8 according to the embodiment, the number of high-level times of the reference signal Cref is counted while the rising edge of the output of the delay element C71 is generated sixteen times, and the number of high-level times of the reference signal Cref is counted while the rising edge of the output of the delay element C91 is generated sixteen times. Further, the adjusting circuit 7 corrects the output current Ib1 so that the count value by the first counter 10 is 0 and the count value by the second counter 11 is 16.

That is, it is counted sixteen times whether the rising edge of the output of the delay element C71 advances from the rising edge of the reference signal Cref, and it is counted sixteen times whether the rising edge of the output of the delay element C91 delays from the rising edge of the reference signal Cref. Thus, it is possible to detect whether the timing of the transition edge from low-level to high-level of the signal of n-th stage of the delay part is matched to the timing of the rising edge of the reference signal Cref.

Moreover, multiple counting is more desirable than counting once because there is a possibility that the outputs of the delay elements C71, C91 cannot be taken into the controlling part 8 correctly due to set-up/hold-time or jitter by only counting once, and because multiple counting makes it possible to more precisely detect whether the transition edge from low-level to high-level of the signal of the delay element C81 of the delay part is matched to the rising edge of the reference signal Cref.

Moreover, the embodiment is not limited to the above embodiment, and it is a matter of course, various improvements and modifications can be performed without departing from the scope of the embodiment.

For example, when it is judged whether the Cnt71 or Cnt91 is 0, a slight range on judgement may be provided in consideration of the set-up/hold-time. For example, when the Cnt71 or Cnt91 is not more than 2, a method can be cited that takes the same processing as the processing in the case where it is judged Cnt71 or Cnt91 is 0. The embodiment can be applied even to such case.

Additionally, when it is judged whether the Cnt71 or Cnt91 is 16, a slight range on judgment may be provided in consideration of the set-up/hold-time. For example, when the Cnt71 or Cnt91 is not less than 14, a method can be cited that takes the same processing as the processing in the case where it is judged Cnt71 or Cnt91 is 16. The embodiment can be applied even to such case.

Additionally, although the circuit, in which only one delay element array of the delay elements C11, C21, C31, C41, C51, C61, C71, C81, and C91 is adjusted, is employed in the embodiment, the embodiment can be applied even to a case where two or more delay element arrays are adjusted.

Moreover, low-level is an example of a first logic level, high-level is an example of a second logic level, the first counter is an example of a first phase comparator, the second counter is an example of a second phase comparator, the reference signal Cref is an example of a first reference signal, the reference signal Vb is an example of a second reference signal, and the adjusting circuit 7 and controlling part 8 are an example of a delay element adjusting part.

A child circuit cannot always have the same delay property as that of a parent circuit due to unevenness in delay elements in a semiconductor device on the same chip even if controlled by using the same control signal in a parent circuit.

The embodiment was carried out in view of the above problem, and it is an proposition by the embodiment to provide a delay adjusting circuit for correcting unevenness in the delay properties caused by the unevenness in semiconductor elements on the same chip.

According to a first aspect of the embodiment, there is provided a delay adjusting circuit comprising: a delay part in which delay elements of n+1 ($n \geq 2$) stages are connected to each other in series; a first phase comparator for detecting whether a first edge that is a transition edge of a signal of an n−1-th stage of the delay part from a first logic level to a second logic level advances from a first reference signal edge that is a transition edge of a first reference signal from the first logic level to the second logic level; a second phase comparator for detecting whether a second edge that is a transition edge of a signal of an n+1-th stage of the delay part from the first logic level to the second logic level delays from the first reference signal edge; and a delay element adjusting part that corrects a second reference signal so that the first edge advances from the first reference signal edge in the first phase comparator and the second edge delays from the first reference signal edge in the second phase comparator, and that outputs a reference bias signal for adjusting delay times of the delay elements of the delay part.

According to a second aspect of the embodiment, there is provided a control method of a delay adjusting circuit having a delay part in which delay elements of n+1 (n≧2) are connected to each other in series, comprising the steps of: detecting whether a first edge that is a transition edge of a signal of the n−1-th stage of the delay part from a first logic level to a second logic level advances from a first reference signal edge that is a transition edge of a first reference signal from the first logic level to the second logic level; detecting whether a second edge that is a transition edge of a signal of the n+1-th stage of the delay part from the first logic level to the second logic level delays from the first reference signal edge; and correcting a second reference signal so that the first edge advances from the first reference signal edge in the step of detecting whether the first edge advances from the first reference signal edge, and that the second edge delays from the first reference signal edge in the step of detecting whether the second edge delays from the first reference signal edge, and outputting a reference bias signal for adjusting delay times of the delay elements of the delay part.

In the embodiment, a delay part detects whether a first edge advances from a first reference signal edge, and detects whether a second edge delays from the first reference signal edge, and delay times of the delay elements of the delay part to the reference signal are corrected and adjusted in accordance with the detection results.

In a delay element adjusting part, when the delay elements of the delay part are adjusted into a state where the first edge advances from the first reference signal edge and the second edge delays from the first reference signal edge, a transition edge of a signal of the n-th stage from a first logic level to a second logic level approximately corresponds to a timing of the first reference signal edge, and can be matched to the timing of the first reference signal edge at high precision regardless of the unevenness in the delay elements.

The aforementioned proposition, novel features and the drawings are for the purpose of illustration of the embodiments are not intended as a definition of the limits of the present invention.

What is claimed is:

1. A delay adjusting circuit comprising:
a delay part in which delay elements of n+1 (n≧2) stages are connected to each other in series, and to which a first reference signal is inputted;
a first counter for counting a transition edge of a signal of an n−1-th stage of the delay part from a first logic level to a second logic level when the first reference signal is at the second logic level;
a second counter for counting a transition edge of a signal of an n+1-th stage of the delay part from the first logic level to the second logic level when the first reference signal is at the second logic level; and a delay element adjusting part for outputting a correct bias signal in response to count result of the first counter and the second counter,
wherein a delay time of the delay part is adjusted, in response to the correct bias signal, to the state in which the first counter does not perform counting operation and the second counter performs counting operation.

2. The delay adjusting circuit according to claim 1, further comprising:
a DLL part having n stages of the same delay elements as the delay elements of the delay part,
wherein the first reference signal is a reference clock signal to be inputted to reference clock input of the DLL part, and
the correct bias signal is a corrected signal of a bias signal for adjusting delay times of the delay elements of the DLL part.

3. The delay adjusting circuit according to claim 1, wherein the delay element comprises a transfer gate of which gate is controlled in response to the correct bias signal and which is provided on a transfer path of the delay element.

4. The delay adjusting circuit according to claim 1, wherein the first counter judges that the signal of the n−1-th stage of the delay part advances from the first reference signal edge when the first counter does not perform counting operation and the signal of the n−1-th stage of the delay part delays from the first reference signal edge when the first counter performs counting operation.

5. The delay adjusting circuit according to claim 1, wherein the second counter judges that the signal of the n+1-th stage of the delay part advances from the first reference signal edge when the second counter does not perform counting operation and the signal of the n+1-th stage of the delay part delays from the first reference signal edge when the second counter performs counting operation.

6. The delay adjusting circuit according to claim 1, wherein counting operations of the first counter and second counter are performed i times (i≧1), and
the correct bias signal is outputted so that a count value outputted by the first counter is 0 and a count value outputted by the second counter is i.

7. The delay adjusting circuit according to claim 6, wherein in the case of i=1, delay times of the delay elements are adjusted to be small when count values by the first counter and second counter are 1, and delay times of the delay elements are adjusted to be large when count values by the first counter and second counter are 0.

8. A control method of a delay adjusting circuit having a delay part in which delay elements of n+1 (n≧2) are connected to each other in series, and to which a first reference signal is inputted, comprising:
counting a transition edge of a signal of an n−1-th stage of the delay part from a first logic level to a second logic level when the first reference signal is at the second logic level;
counting a transition edge of a signal of an n+1-th stage of the delay part from the first logic level to the second logic level when the first reference signal is at the second logic level;
outputting a correct bias signal in response to the counting the transition edge of the signal of the n−1-th stage of the delay part and the counting the transition edge of the signal of the n+1-th stage of the delay part; and adjusting a delay time of the delay part in response to the outputting to the state in which the transition edge of the signal of the n−1-th stage of the delay part is not counted and the transition edge of the signal of the n+1-th stage of the delay part is counted.

9. The control method of a delay adjusting circuit according to claim 8, wherein counting operations of the counting the transition edge of the signal of the n−1-th stage of the delay part and the counting the transition edge of the signal of the n+1-th stage of the delay part are performed i times ($i \geq 1$), and the outputting the correct bias signal includes the outputting the correct bias signal so that a count value by the transition edge of the signal of the n−1-th stage of the delay part is 0 and a count value by the transition edge of a signal of the n+1-th stage of the delay part is i.

* * * * *